United States Patent
Harada

(10) Patent No.: US 9,335,222 B2
(45) Date of Patent: May 10, 2016

(54) POWER CONVERSION DEVICE INCLUDING ABNORMALITY DETECTION FUNCTION OF LC FILTER

(71) Applicant: FANUC Corporation, Yamanashi (JP)

(72) Inventor: Takashi Harada, Yamanashi (JP)

(73) Assignee: FANUC CORPORATION, Yamanashi (JP)

(*) Notice: Subject to any disclaimer, the term of this patent is extended or adjusted under 35 U.S.C. 154(b) by 0 days.

(21) Appl. No.: 14/549,156

(22) Filed: Nov. 20, 2014

(65) Prior Publication Data

US 2015/0145523 A1    May 28, 2015

(30) Foreign Application Priority Data

Nov. 28, 2013  (JP) .................................. 2013-246683

(51) Int. Cl.
*G01R 19/22* (2006.01)
*H02M 1/12* (2006.01)
*G01K 3/08* (2006.01)
*G01R 31/42* (2006.01)
*H02M 7/02* (2006.01)
*H02M 7/00* (2006.01)

(52) U.S. Cl.
CPC  *G01K 3/08* (2013.01); *G01R 19/22* (2013.01); *G01R 31/42* (2013.01); *H02M 7/02* (2013.01); *H02M 7/00* (2013.01)

(58) Field of Classification Search
CPC ........ G01R 19/03; G01R 19/22; G01R 31/40; G01R 31/42; G01K 3/08; H02M 7/00; H02M 7/02; H02M 1/12; H02M 1/126; H02M 1/14
USPC ........ 324/119, 539, 537, 500; 363/13, 15, 34, 363/44, 52, 108, 143
See application file for complete search history.

(56) References Cited

U.S. PATENT DOCUMENTS

| | | | | |
|---|---|---|---|---|
| 3,723,845 A | * | 3/1973 | Duckworth | G01R 19/03 324/106 |
| 4,109,308 A | * | 8/1978 | Rodel | G01R 19/22 324/119 |
| 4,713,604 A | * | 12/1987 | Becker | H02H 7/16 324/500 |
| 8,283,880 B2 | * | 10/2012 | Iwashita | H02M 7/797 318/362 |
| 8,384,335 B2 | * | 2/2013 | Kuroki | H02M 5/4585 318/434 |
| 9,124,210 B2 | * | 9/2015 | Yamamoto | H02P 27/08 |

(Continued)

FOREIGN PATENT DOCUMENTS

| | | |
|---|---|---|
| JP | 62-226707 A | 10/1987 |
| JP | H08-66036 A | 3/1996 |

(Continued)

*Primary Examiner* — Hoai-An D Nguyen

(74) *Attorney, Agent, or Firm* — Hauptman Ham, LLP

(57) ABSTRACT

The power conversion device includes an AC power source, a power conversion unit, and an LC filter unit arranged between the AC power source and the power conversion unit, and the LC filter unit has a temperature detection element provided in one part or in a plurality of parts configuring the LC filter unit, and the power conversion unit has a temperature detection unit configured to receive temperature data detected by the temperature detection element and a determination unit configured to calculate temperature rise values of one or plurality of parts, or temperature differences between the plurality of parts based on the temperature data received by the temperature detection unit and to determine whether or not there is an abnormality in the LC filter unit in accordance with the calculation result.

2 Claims, 7 Drawing Sheets

(56) References Cited

U.S. PATENT DOCUMENTS

| | | | |
|---|---|---|---|
| 2008/0304303 A1* | 12/2008 | Hsieh | H05K 7/20209 363/141 |
| 2014/0152251 A1* | 6/2014 | Kim | H02J 7/025 320/108 |
| 2014/0176100 A1* | 6/2014 | Hara | H02M 5/293 323/282 |

FOREIGN PATENT DOCUMENTS

| | | |
|---|---|---|
| JP | 2006-317112 A | 11/2006 |
| JP | 2007-221858 A | 8/2007 |
| JP | 2009-219317 A | 9/2009 |
| JP | 2011-193614 A | 9/2011 |

\* cited by examiner

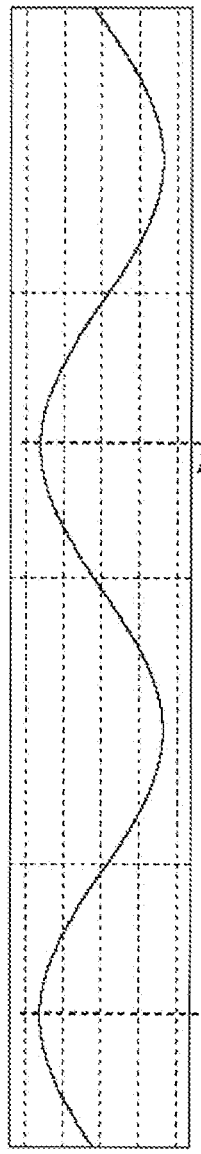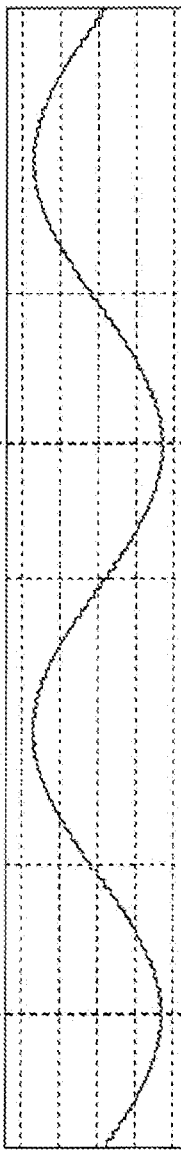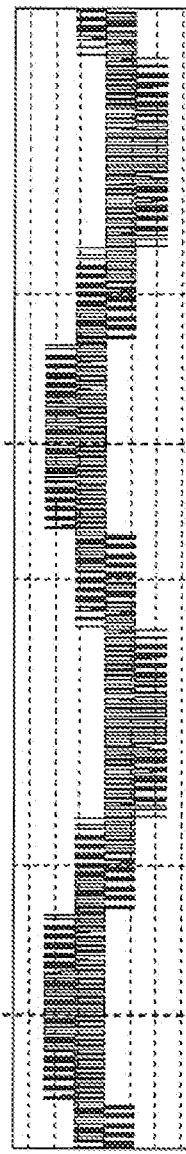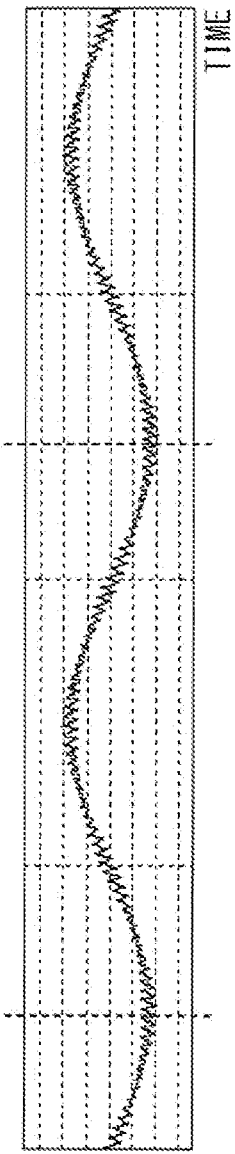
FIG. 2A  LC FILTER "A" PORTION VOLTAGE
FIG. 2B  LC FILTER "A" PORTION CURRENT
FIG. 2C  LC FILTER "B" PORTION VOLTAGE
FIG. 2D  LC FILTER "B" PORTION CURRENT

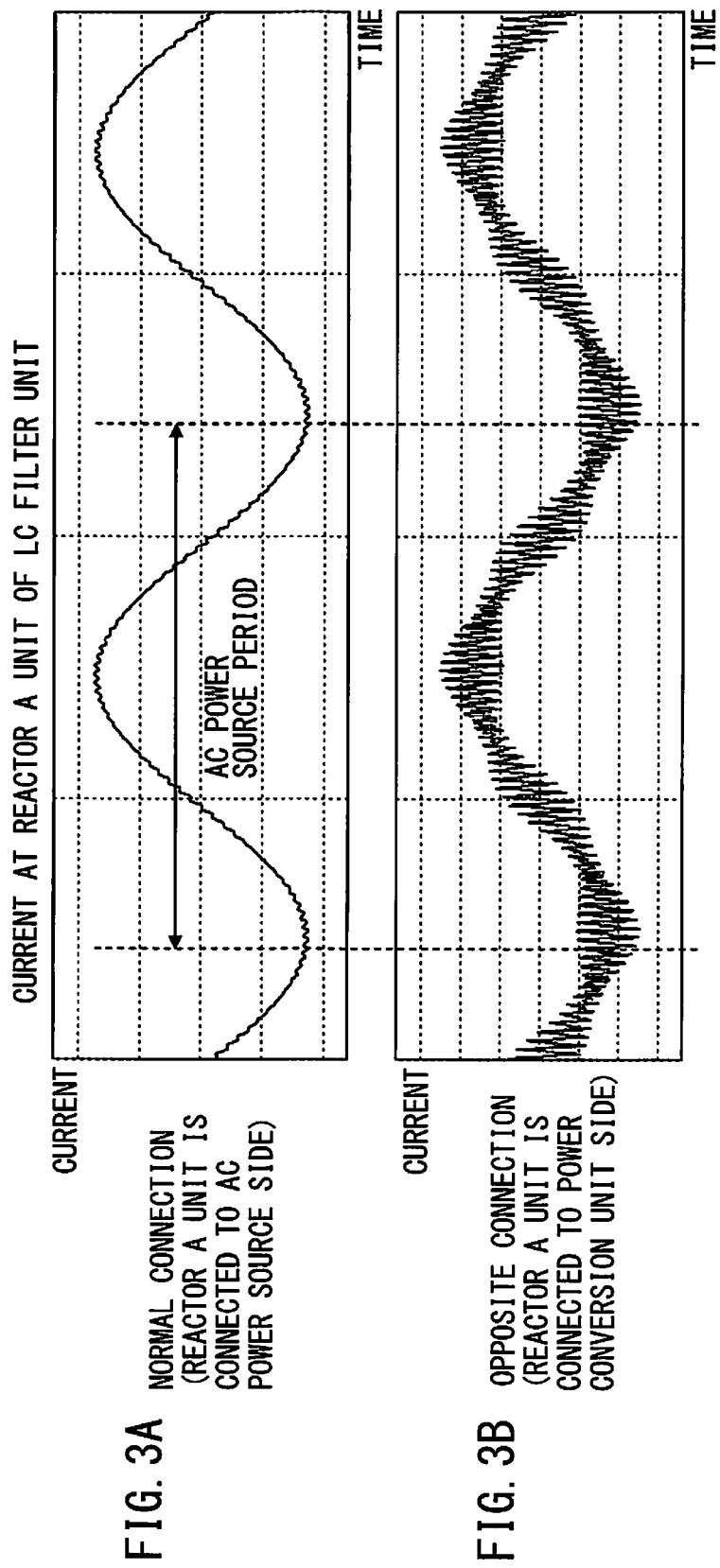

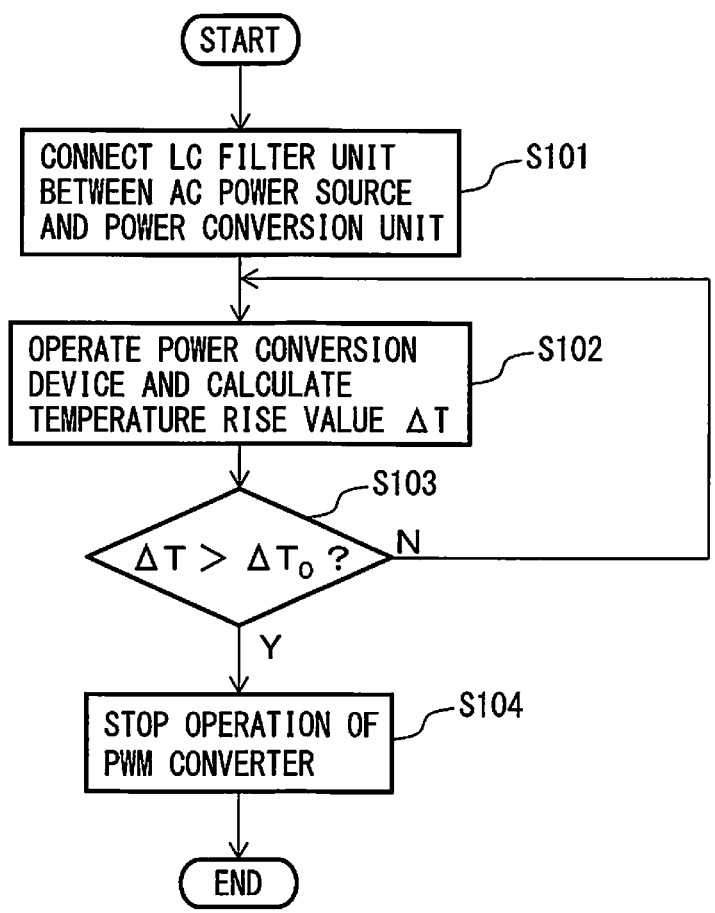

POWER CONVERSION DEVICE INCLUDING ABNORMALITY DETECTION FUNCTION OF LC FILTER

CROSS-REFERENCE TO RELATED APPLICATIONS

This application is a new U.S. patent application that claims benefit of JP 2013-246683, filed on Nov. 28, 2013, the entire content of JP 2013-246683 is hereby incorporated by reference.

FIELD OF THE INVENTION

The present invention relates to a power conversion device that converts an alternating-current (AC) power source into a direct-current (DC) power source or a DC power source into an AC power source, and particularly, to a power conversion device including an abnormality detection function of an LC filter.

BACKGROUND OF THE INVENTION

A PWM converter is known as a device that suppresses a harmonic current included in a load current and improves a power factor by performing switching control by pulse width modulation (PWM) on an AC power source used in a motor drive device (e.g., Japanese Unexamined Patent Publication No. JP-A-2007-221858).

A PWM converter performs switching control by PWM, and therefore, outputs a square wave AC voltage including high frequencies of several kHz or higher in a path to an AC power source. The square wave AC voltage includes high frequency components not included in the power source frequency. Because of this, the PWM converter of this kind generally has a configuration in which a low-pass filter (LC filter) to allow the AC voltage of the power source frequency component of the high frequency square waves to pass through is provided between the AC power source and the PWM converter to remove high frequency components.

As an LC filter for a PWM converter, a filter called a T-type filter is known, which is equipped with an inductance (L) at both ends of a circuit in which a capacitor (C) and a damping resistor are connected in series. The LC filter adopts an asymmetrical configuration in which, in general, the inductance on the PWM converter side is large and the inductance on the AC power source side is small in order to reduce the size of the filter as a whole while suppressing the peak of the high frequency current that flows in from the PWM converter side.

Further, because the high frequency current does not flow through the inductance on the AC power source side, as the inductance on the AC power source side, in general, a compact inductance, the cost of which has been reduced by obviating measures against heat produced by the high frequency current, is used.

The LC filter unit of the conventional power conversion device does not include a mechanism to positively detect opposite connection of input and output lines. In the LC filter having the above-described asymmetrical configuration, even in the case where the PWM converter side and the AC power source side are erroneously connected oppositely (hereinafter, this state is called "opposite connection of input and output lines"), the operation is continued and because the inductance on the AC power source side is small, a high frequency overcurrent flows in from the PWM converter side. As a result, an abnormal sound is produced from the inductance on the AC power source side and the inductance on the AC power source side and the damping resistor overheat. If the operation is continued in this state, the part of the LC filter may break.

An object of the present invention is to provide a power conversion device capable of preventing a malfunction of the device due to opposite connection of input and output lines of the LC filter unit and breakage of the device.

SUMMARY OF THE INVENTION

The power conversion device according to an embodiment of the present invention is a power conversion device having an AC power source, a power conversion unit configured to convert an AC voltage into a DC voltage, and an LC filter unit arranged between the AC power source and the power conversion unit, and is characterized in that the LC filter unit has an AC power source connection unit configure to connect with the AC power source, a power conversion connection unit configured to connect with the power conversion unit, and a temperature detection element provided in one part or in a plurality of parts configuring the LC filter unit, and in that the power conversion unit has a temperature detection unit configured to receive temperature data detected by the temperature detection element and a determination unit configured to determine whether or not there is an abnormality in the LC filter unit in accordance with the results of calculation by calculating a temperature rise value in the one part or temperature rise values in predetermined parts of the plurality of parts, or temperature differences between the plurality of parts based on the temperature data received by the temperature detection unit.

DESCRIPTION OF THE DRAWINGS

These and other features and advantages of the present invention will be better understood by reading the following detailed description, taken together with the drawings wherein:

FIG. 2A is a diagram illustrating a waveform of a voltage at an A portion of an LC filter unit;

FIG. 2B is a diagram illustrating a waveform of a current at the A portion of the LC filter unit;

FIG. 2C is a diagram illustrating a waveform of a voltage at a B portion of the LC filter unit;

FIG. 2D is a diagram illustrating a waveform of a current at the B portion of the LC filter unit;

FIG. 3A is a diagram illustrating a waveform of a current flowing through a reactor A unit when the LC filter unit is connected so that the reactor A unit is connected to an AC power source side;

FIG. 3B is a diagram illustrating a waveform of a current flowing through the reactor A unit when the LC filter unit is connected so that the reactor A unit is connected to a power conversion unit side;

FIG. 4 is a flowchart for explaining an operation procedure of the power conversion device according to the first embodiment of the present invention;

DETAILED DESCRIPTION OF THE PREFERRED EMBODIMENT

Hereinafter, with reference to the drawings, a power conversion device according to the present invention is explained. However, it should be noted that the technical scope of the present invention is not limited to embodiments below but encompasses the inventions described in the claims and equivalents thereof.

First Embodiment

Figure 1:
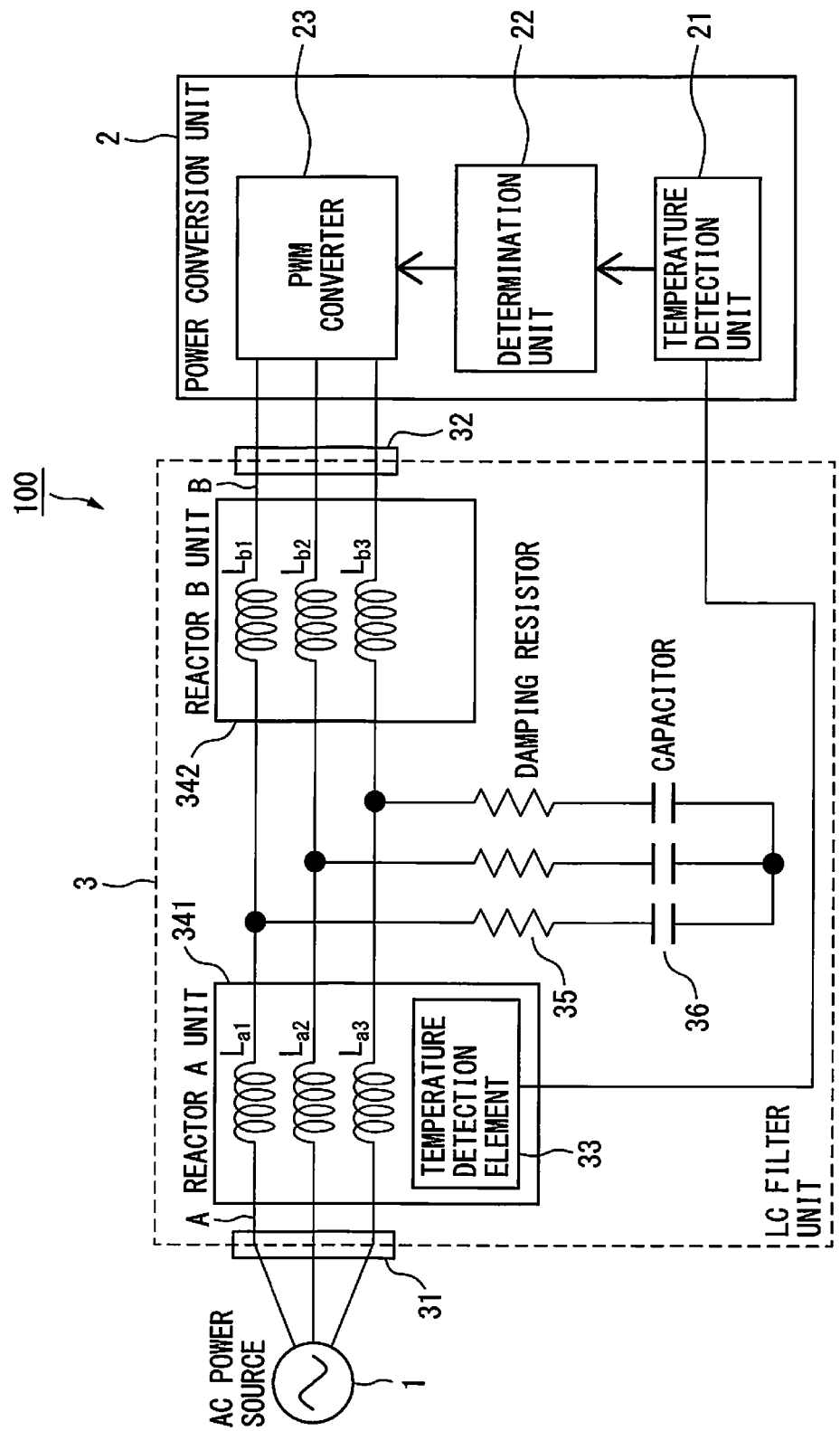
FIG. 1 is a configuration diagram of a power conversion device according to a first embodiment of the present invention.

A configuration diagram of a power conversion device 100 according to a first embodiment of the present invention is illustrated in FIG. 1. The power conversion device 100 according to the first embodiment is a power conversion device having an alternating-current (AC) power source 1, a power conversion unit 2 configured to convert an AC voltage into a DC voltage, and an LC filter unit 3 arranged between the AC power source 1 and the power conversion unit 2, and characterized in that the LC filter unit 3 has an AC power source connection unit 31 configured to connect with the AC power source 1, a power conversion connection unit 32 configured to connect with the power conversion unit 2, and a temperature detection element 33 provided in one part or in a plurality of parts configuring the LC filter unit 3, and in that the power conversion unit 2 has a temperature detection unit 21 configured to receive temperature data detected by the temperature detection element 33 and a determination unit 22 configured to determine whether or not there is an abnormality in the LC filter unit 3 in accordance with the results of calculation by calculating a temperature rise value in the one part or temperature rise values in predetermined parts of the plurality of parts, or temperature differences between the plurality of parts based on the temperature data received by the temperature detection unit 21.

The power conversion device 100 according to the first embodiment of the present invention has a configuration in which the T-type LC filter unit 3 is provided between the power conversion unit 2 including a PWM converter 23 and the three-phase AC power source 1, and the temperature detection element 33 is arranged in one area of a reactor A unit 341 including inductances $L_{a1}$ to $L_{a3}$ connected to the AC power source 1 side. The LC filter unit 3 has the reactor unit (reactor A unit 341) connected with the AC power source connection unit 31 and the reactor A unit 341 includes the temperature detection element 33. As the temperature detection element 33, a thermistor or a thermostat may be used, but the temperature detection element 33 is not limited to those.

The LC filter unit 3 illustrated in FIG. 1 has an asymmetrical configuration. In other words, the values $L_{a1}$ to $L_{a3}$ of the inductances of the reactor A unit 341 connected to the AC power source 1, which is the three-phase AC power source, are smaller than values $L_{b1}$ to $L_{b3}$ of inductances of a reactor B unit 342 connected to the power conversion unit 2.

The LC filter unit 3 includes the AC power source connection unit 31 configured to connect with the AC power source 1 and the power conversion connection unit 32 configured to connect with the power conversion unit 2 and the state where the AC power source 1 is connected to the AC power source connection unit 31 and the power conversion unit 2 is connected to the power conversion connection unit 32 is the normal connection state. On the other hand, the state where the AC power source 1 is connected to the power conversion connection unit 32 and the power conversion unit 2 is connected to the AC power source connection unit 31 is referred to as an "opposite connection state". In the case where the power lines are connected oppositely, compared to the case where connection is normal, the temperature rise area of the part of the LC filter unit 3 is different from the temperature rise area in the normal connection state. In other words, there is a case where in the part where the rise in temperature is small in the normal connection state, the rise in temperature becomes large in the opposite connection state. Consequently, in the present invention, the temperature detection element 33 is provided in one part or in a plurality of parts of the LC filter unit 3, and the determination unit 22 is provided, which is configured to determine that there is a possibility of the opposite connection of the power lines when detecting that the value of the rise in temperature detected by the temperature detection unit 21 is higher than that in the case of the normal connection, and thereby, the PWM converter 23 is stopped.

Next, waveforms of a voltage and a current in the case where the LC filter unit 3 is connected normally between the AC power source 1 and the power conversion unit 2 and in the case where connection is made oppositely, respectively, are explained. FIGS. 2A to 2D illustrate waveforms of a voltage and a current at the A portion and the B portion in FIG. 1 in the case where connection is normal. In the case where connection is normal, as illustrated in FIGS. 2A to 2D, to the A portion of the LC filter unit 3, a sinusoidal wave voltage is applied (FIG. 2A) and to the B portion, a square wave voltage including high frequency components is applied (FIG. 2C). Because of this, through the B portion of the LC filter unit 3, a current including ripple components (high frequency components) flows (FIG. 2D). However, by virtue of the low-pass filter effect of the LC filter unit 3, through the A portion of the LC filter unit 3, a current substantially in the shape of a sinusoidal wave in which ripple components are reduced flows (FIG. 2B).

FIGS. 3A and 3B illustrate currents that flow through the A portion of the LC filter unit 3 in the case where the LC filter unit 3 is connected normally and in the case where connection is made oppositely.

In the case where the reactor A unit and the reactor B unit are connected normally, as illustrated in FIG. 2B, through the inductance at the A portion, a current substantially in the shape of a sinusoidal wave in which ripple components are reduced flows (FIG. 3A). On the other hand, in the case where the A portion and the B portion are connected oppositely, through the inductance at the A portion, a current including ripple components flows and the size of the ripple component is several times as large as that of the current that flows through the B portion in the case where connection is made normally in FIG. 2D (FIG. 3B).

In the case where the situation in which the A portion and the B portion are connected oppositely (opposite connection of power lines) is left to stand, the reactor A unit 341 is originally designed on the supposition that a current not including ripple components flows, and therefore, there is a possibility that an abnormal sound will be produced at the core part or abnormal heat will be produced at the core part of the inductance and at the same time, a damping resistor 35 and a capacitor 36 into which ripple components flow will be damaged due to an increase in ripple components.

However, in the case where the current as illustrated in FIG. 3B flows, the temperature of the inductance of the reactor A unit 341 becomes higher without exception than the temperature in the case where connection is normal. Because of this, by comparing the temperature data detected by the temperature detection element 33 attached to the reactor A unit 341 with the temperature rise value from the start of the operation in the case where connection is made normally stored in advance in the power conversion unit 2, it is possible to determine that the power lines are connected oppositely in the case where the detected temperature exceeds the temperature at the normal time, and then by stopping switching of the PWM converter 23, it is possible to prevent the abnormal heat production in the LC filter unit 3 and damage thereto.

Next, a method for detecting the presence/absence of an abnormality in the power conversion device according to the first embodiment of the present invention is explained by using a flowchart illustrated in FIG. 4.

First, at step S101, the LC filter unit 3 is connected between the AC power source 1 and the power conversion unit 2 as illustrated in FIG. 1. Further, the temperature detection element 33 provided in the reactor A unit 341 of the LC filter unit 3 and the temperature detection unit 21 provided in the power conversion unit 2 are connected.

Next, at step S102, the power conversion device 100 is caused to operate. At this time, the temperature detection unit 21 continuously receives temperature data from the temperature detection element 33 from the start of the operation and calculates a temperature rise value $\Delta T$ from the start of the operation.

Next, at step S103, the determination unit 22 determines whether or not the temperature rise value $\Delta T$ of the reactor A unit 341 exceeds a temperature rise value $\Delta T_0$ at the time of the normal connection stored in a memory (not illustrated) in advance.

In the case where the temperature rise value $\Delta T$ exceeds $\Delta T_0$ ($\Delta T > \Delta T_0$), the determination unit 22 determines that the LC filter unit 3 is connected oppositely at step S104 and stops the operation of the PWM converter 23. On the other hand, in the case where the temperature rise value $\Delta T$ is equal to or less than $\Delta T_0$ ($\Delta T \leq \Delta T_0$), the determination unit 22 determines that no abnormality has occurred in the LC filter unit 3 and then returns to step S102 and causes the PWM converter 23 to continue the operation.

By the above, it is possible to determine the presence/absence of opposite connection from the temperature rise value of the reactor of the LC filter unit.

The configuration in which only one temperature detection element is provided within the LC filter unit is described in the power conversion device according to the first embodiment described above. However, the configuration is not limited to this and two or more temperature detection elements may be provided.

Further, in the first embodiment, the example is described, in which an abnormality in the LC filter unit is detected by detecting the temperature of the reactor A unit. However, the example is not limited to this and it may also be possible to detect an abnormality in the LC filter unit by measuring the temperature of a part other than the reactor unit, such as a damping resistor or a capacitor.

Second Embodiment

Figure 5:
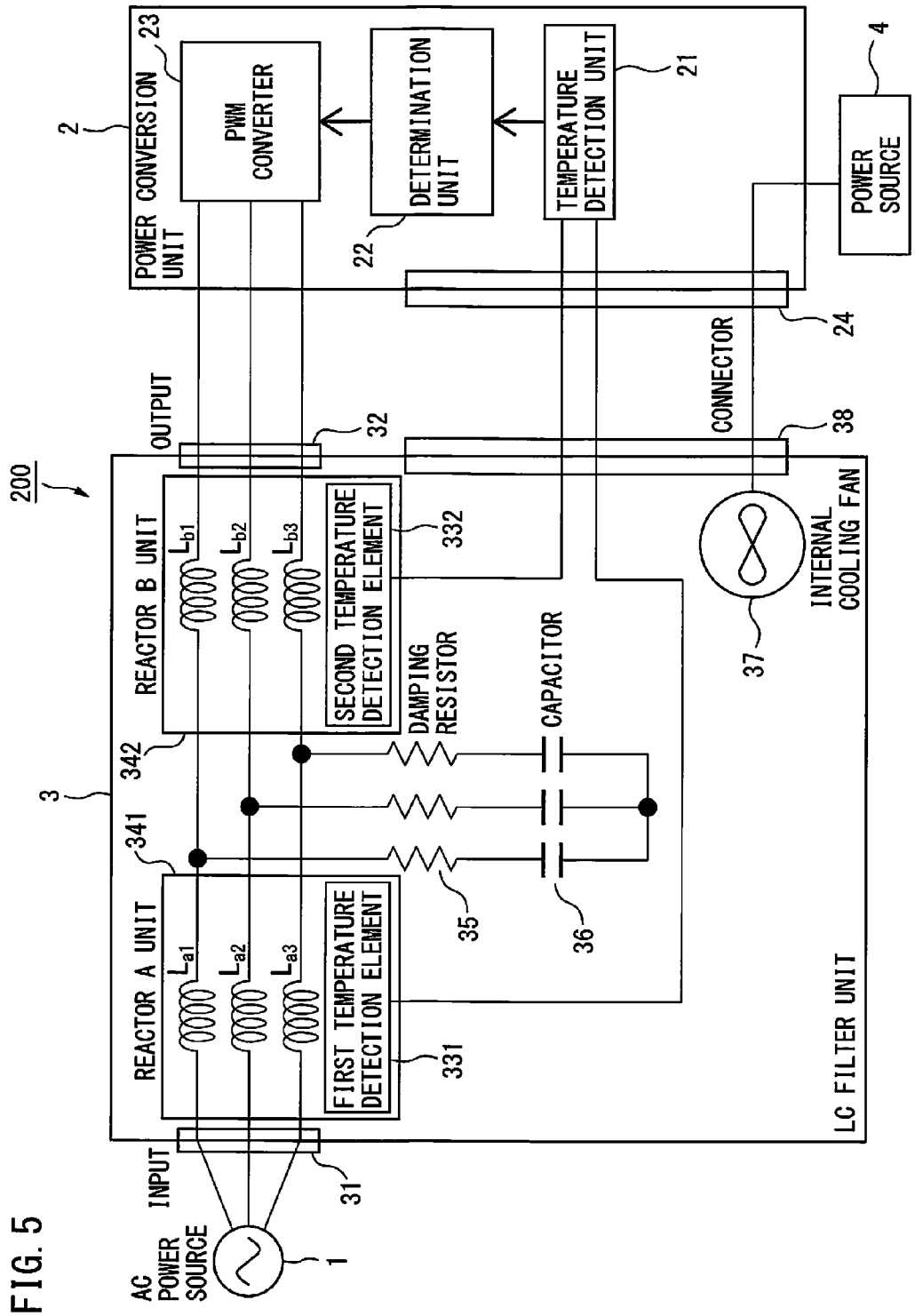
FIG. 5 is a configuration diagram of a power conversion device according to a second embodiment of the present invention.

Next, a power conversion device according to a second embodiment of the present invention is explained. A configuration diagram of a power conversion device 200 according to the second embodiment is illustrated in FIG. 5. The power conversion device 200 according to the second embodiment differs from the power conversion device 100 according to the first embodiment in that the temperature detection element is provided not only in the reactor A unit 341 but also in the reactor B unit 342. In other words, the LC filter unit 3 includes the reactor A unit 341 connected with the AC power source connection unit 31 and the reactor B unit 342 connected with the power conversion connection unit 32, and the reactor A unit 341 includes a first temperature detection element 331 and the reactor B unit 342 includes a second temperature detection element 332. The rest of the configuration is the same as that of the power conversion device 100 according to the first embodiment, and therefore, detailed explanation is omitted.

In the power conversion device 200 of the second embodiment, two temperature detection elements, i.e., the first temperature detection element 331 and the second temperature detection element 332 are provided in the LC filter unit 3. Because of this, it is possible to detect the opposite connection of the power lines based on that the temperature of the reactor B unit 342 is higher than the temperature of the reactor A unit 341 by a specified value or more by using not only the absolute values of the detected temperature data of the reactor A unit 341 and the reactor B unit 342, respectively, but also the relative value between the respective detected pieces of temperature data. In this case, it is possible to eliminate the influence of the ambient temperature, and therefore, it is possible to implement detection with a higher accuracy.

Further, there is a case where an abnormal temperature rise occurs in the LC filter unit due to a cause other than the opposite connection of the power lines. In the case where the power conversion device becomes overloaded, the current flowing through the reactor A unit and the reactor B unit becomes an overcurrent and an abnormal temperature rise occurs. Further, in the case where the reactor A unit and the reactor B unit are cooled forcedly by a cooling fan to suppress a temperature rise, when the cooling fan fails and stops, an abnormal temperature rise occurs in the reactor A unit and the reactor B unit as a result. It is possible to detect an abnormality on the power conversion device side by the temperature rise exceeding a normal value in the reactor A unit or the reactor B unit even if the cause is the overloaded state of the power conversion device or the abnormality in the cooling fan. However, it is desirable to detect an abnormality while simultaneously identifying its cause in order to improve workability when removing the abnormality. In the case where there is a plurality of temperature detection elements, it is possible to identify the cause of an abnormality as well as providing protection by making use of the fact that the temperature rise pattern is different for different kinds of abnormality.

In the power conversion device 100 according to the first embodiment illustrated in FIG. 1, it is difficult to determine whether an abnormality temperature rise is caused by the failure of the cooling fan (not illustrated), the operation in the overloaded state, or the opposite connection of the power lines because there is only one temperature detection element. On the other hand, in the power conversion device 200 according to the second embodiment illustrated in FIG. 5, by attaching the temperature detection element also to the reactor B unit 342, it is possible to determine that the cooling fan has failed or the operation is performed in an overloaded state when the temperature of the reactor B unit 342 becomes higher than the temperature in the normal state, or to determine that the power lines are connected oppositely when only the temperature of the reactor A unit 341 becomes high. As described above, by providing the temperature detection element both in the reactor A unit and in the reactor B unit, it is possible to accurately detect the spot where an abnormality has occurred.

Figure 6:
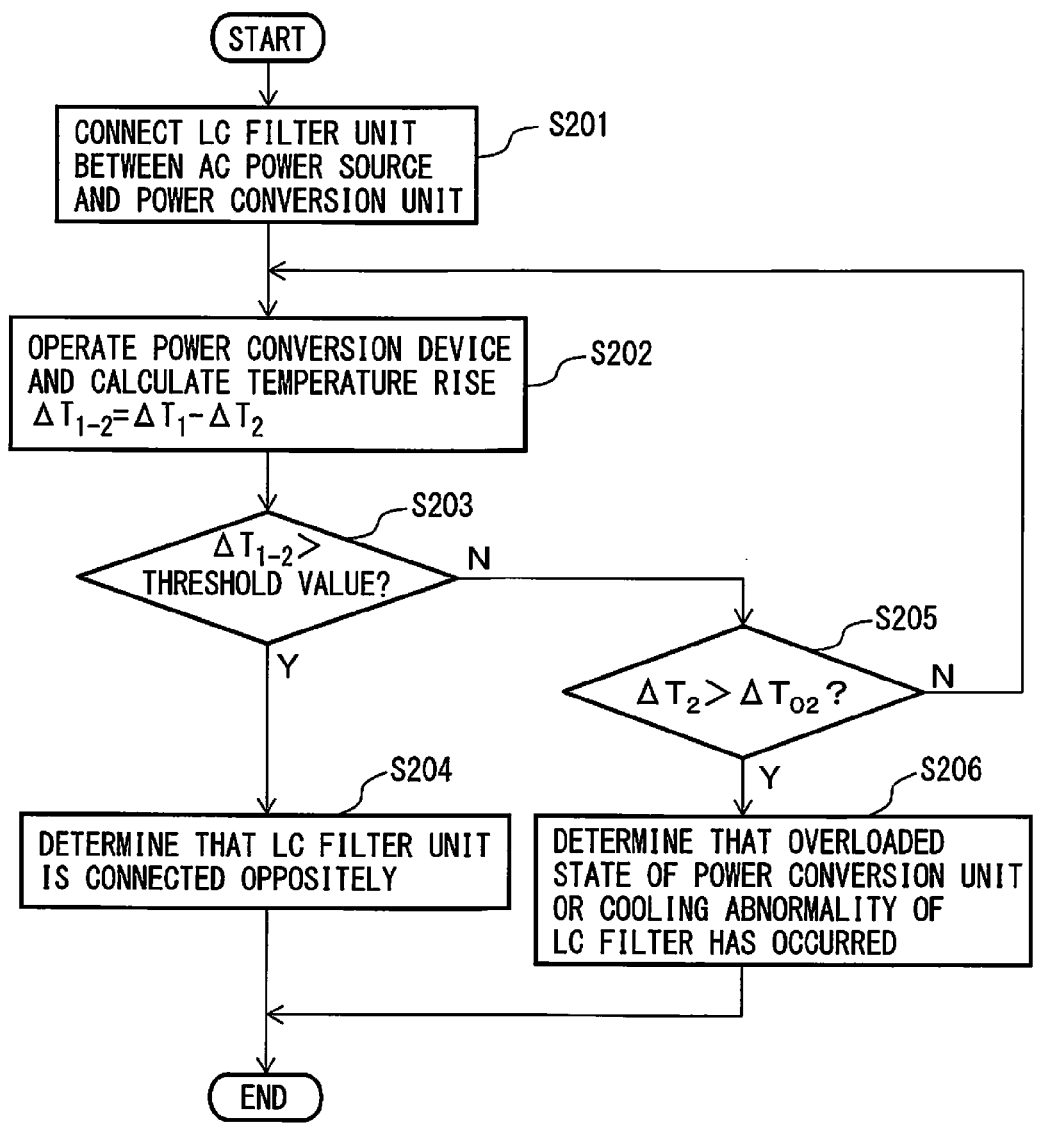
FIG. 6 is a flowchart for explaining an operation procedure of the power conversion device according to the second embodiment of the present invention.

Next, a method for detecting the presence/absence of an abnormality in the power conversion device according to the second embodiment of the present invention is explained by using a flowchart illustrated in FIG. 6.

First, at step S201, the LC filter unit 3 is connected between the AC power source 1 and the power conversion unit 2 as illustrated in FIG. 5. Further, the first temperature detection element 331 provided in the reactor A unit 341 of the LC filter unit 3 and the second temperature detection element 332 provided in the reactor B unit 342 are connected with the temperature detection unit 21 provided in the power conversion unit 2.

Next, at step S202, the power conversion device 200 is caused to operate. The temperature detection unit 21 continuously receives temperature data $T_1$ from the first temperature detection element 331 and temperature data $T_2$ from the second temperature detection element 332 from the start of the operation, and calculates a difference $\Delta T_{1-2}=\Delta T_1-\Delta T_2$ between a temperature rise value $\Delta T_1$ of $T_1$ from the start of the operation and a temperature rise value $\Delta T_2$ of $T_2$ from the start of the operation.

Next, at step S203, the determination unit 22 determines whether $\Delta T_{1-2}$ is a positive value by determining whether or not $\Delta T_{1-2}$ exceeds a threshold value. In the case of perfect cooling, the normal value of $\Delta T_{1-2}$ is zero, and therefore, a margin to a certain extent in the positive value direction is provided to the threshold value for determination in order to prevent erroneous detection. In the case where it is determined that $\Delta T_{1-2}$ has exceeded the threshold value by the present determination, at step S204, it is determined that the LC filter unit 3 is connected oppositely, i.e., the power conversion unit 2 is connected to the AC power source connection unit 31 and the AC power source 1 is connected to the power conversion connection unit 32, and therefore, a connection abnormality has occurred.

Next, at step S205, the determination unit 22 determines whether the temperature rise value $\Delta T_2$ of the reactor B unit 342 has exceeded a temperature rise value $\Delta T_{O2}$ at the time of the normal connection stored in a memory (not illustrated) in advance. As a result, in the case where it is determined that $\Delta T_2$ has exceeded $\Delta T_{O2}$, the determination unit 22 determines that the overloaded state of the power conversion unit 2 or the cooling abnormality of the LC filter unit 3 has occurred at step S206.

On the other hand, in the case where it is determined that there is no abnormality at step S203 and at step S205, the determination unit 22 determines that no abnormality has occurred in the LC filter unit 3, and returns to step S202 and causes the PWM converter 23 to continue the operation.

In the above explanation of the power conversion device according to the second embodiment, the example is described in which the presence/absence of an abnormality in the LC filter unit is detected based on the temperature difference between the reactor A unit and the reactor B unit. However, the example is not limited to this and it may also be possible to detect the presence/absence of an abnormality in the LC filter unit based on the temperature difference between parts other than the reactors, for example, a plurality of damping resistors or a plurality of capacitors.

Third Embodiment

Figure 7:
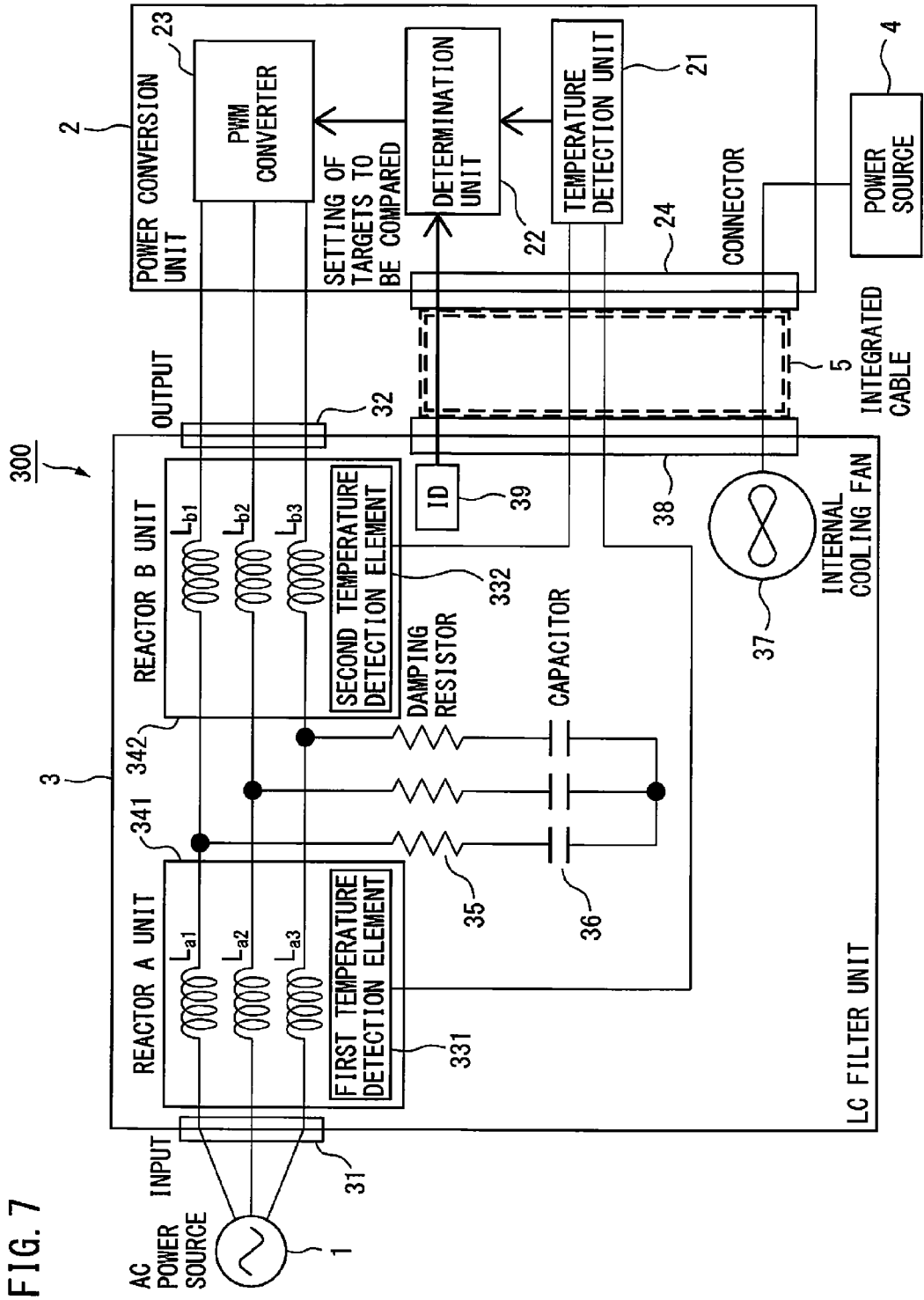
FIG. 7 is a configuration diagram of a power conversion device according to a third embodiment of the present invention.

Next, a power conversion device according to a third embodiment of the present invention is explained. FIG. 7 is a configuration diagram of a power conversion device 300 according to the third embodiment of the present invention. The power conversion device 300 according to the third embodiment differs from the power conversion device 200 according to the second embodiment in that the LC filter unit 3 is configured as one casing in the configuration of the power conversion device according to the second embodiment illustrated in FIG. 5 and at the same time, a cooling fan 37 and an ID 39 by which the power conversion unit 2 identifies the temperature rise value when the connection of the LC filter unit 3 is normal are provided in the LC filter unit 3, and signals related thereto are connected en bloc to the power conversion unit 2 by one connector 24 and a cable 5. The rest of the configuration is the same as that of the power conversion device 200 according to the second embodiment, and therefore, detailed explanation is omitted.

In the power conversion device according to the third embodiment, the LC filter unit 3 and the power conversion unit 2 communicate signals with each other. Here, the signals include at least one of the detection results of the temperature detection elements 331 and 332, identification information (ID) on a power source 4 of the cooling fan 37 of the LC filter unit 3, and identification information on the LC filter unit 3.

According to the power conversion device described in the third embodiment, even in the case where the temperature rise when the connection of the LC filter unit 3 is normal is different for different models of the LC filter, it is made possible to set an optimum threshold value for detecting a temperature rise by referring to the ID 39 provided in the LC filter unit 3 and by reading the temperature rise value at the normal time based on the ID.

As explained above, according to the present invention, by positively detecting that the inputs and outputs of the power lines of the LC filter are connected oppositely by means of the temperature detection element, it is possible to prevent trouble (abnormal sound or overheating) that will occur in the components due to the opposite connection of the input and output lines and to prevent the overloaded state and the abnormality in the cooling unit at the time of the normal connection.

What is claimed is:
1. A power conversion device, comprising:
an AC power source;
a power conversion unit configured to convert an AC voltage into a DC voltage; and
an LC filter unit arranged between the AC power source and the power conversion unit, wherein
the LC filter unit includes:
an AC power source connection unit configured to connect with the AC power source;
a power conversion connection unit configured to connect with the power conversion unit; and
a temperature detection element provided in one part or in a plurality of parts configuring the LC filter unit,
the power conversion unit includes:
a temperature detection unit configured to receive temperature data detected by the temperature detection element; and
a determination unit configured to calculate a temperature rise value of the one part or temperature rise values of predetermined parts of the plurality of parts, or temperature differences between the plurality of parts based on the temperature data received by the temperature detection unit and to determine whether or not there is an abnormality in the LC filter unit in accordance with the calculation result,
the LC filter unit further includes:
a reactor A unit connected with the AC power source connection unit; and a reactor B unit connected with the power conversion connection unit, the reactor A unit includes a first temperature detection element, and the reactor B unit includes a second temperature detection element, and in a case where the temperature rise value of the reactor A unit is larger than the temperature rise value of the reactor B unit, the determination unit determines that a connection abnormality has occurred in which the power conversion unit is connected to the AC power source connection unit and the AC power source is connected to the power conversion connection unit.

2. A power conversion device, comprising:

an AC power source;

a power conversion unit configured to convert an AC voltage into a DC voltage; and an LC filter unit arranged between the AC power source and the power conversion unit, wherein the LC filter unit includes:

an AC power source connection unit configured to connect with the AC power source;

a power conversion connection unit configured to connect with the power conversion unit; and a temperature detection element provided in one part or in a plurality of parts configuring the LC filter unit, the power conversion unit includes:

a temperature detection unit configured to receive temperature data detected by the temperature detection element; and a determination unit configured to calculate a temperature rise value of the one part or temperature rise values of predetermined parts of the plurality of parts, or temperature differences between the plurality of parts based on the temperature data received by the temperature detection unit and to determine whether or not there is an abnormality in the LC filter unit in accordance with the calculation result, the LC filter unit further includes:

a reactor A unit connected with the AC power source connection unit; and a reactor B unit connected with the power conversion connection unit, the reactor A unit includes a first temperature detection element, and the reactor B unit includes a second temperature detection element, and in a case where the temperature rise value of the reactor A unit or the temperature rise value of the reactor B unit is higher than that at the normal time, and the temperature rise value of the reactor B unit is larger than the temperature rise value of the reactor A unit, the determination unit determines that an overloaded state of the power conversion unit or a cooling abnormality of the LC filter unit has occurred.

* * * * *